(12) United States Patent
Lee et al.

(10) Patent No.: US 9,035,319 B2
(45) Date of Patent: May 19, 2015

(54) NITRIDE SEMICONDUCTOR AND FABRICATING METHOD THEREOF

(71) Applicant: Kyungpook National University Industry-Academic Cooperation Foundation, Daegu (KR)

(72) Inventors: Jung-hee Lee, Daegu (KR); Ki-sik Im, Daegu (KR); Dong-seok Kim, Daegu (KR); Hee-sung Kang, Daegu (KR); Dong-hyeok Son, Gyeongsanguk-do (KR)

(73) Assignee: KYUNGPOOK NATIONAL UNIVERSITY INDUSTRY-ACADEMIC COOPERATION FOUNDATION, Daegu (KR)

( * ) Notice: Subject to any disclaimer, the term of this patent is extended or adjusted under 35 U.S.C. 154(b) by 19 days.

(21) Appl. No.: 13/967,923

(22) Filed: Aug. 15, 2013

(65) Prior Publication Data

US 2014/0103352 A1    Apr. 17, 2014

(30) Foreign Application Priority Data

Oct. 16, 2012 (KR) .................. 10-2012-0114873

(51) Int. Cl.
| | | |
|---|---|---|
| H01L 29/15 | (2006.01) | |
| H01L 31/0256 | (2006.01) | |
| H01L 21/20 | (2006.01) | |
| H01L 21/36 | (2006.01) | |
| H01L 29/20 | (2006.01) | |
| H01L 21/02 | (2006.01) | |
| H01L 29/739 | (2006.01) | |
| H01L 29/78 | (2006.01) | |

(52) U.S. Cl.
CPC ...... *H01L 29/2003* (2013.01); *H01L 21/02365* (2013.01); *H01L 29/7391* (2013.01); *H01L 29/785* (2013.01)

(58) Field of Classification Search
CPC .............................. H01L 29/20; H01L 21/02
USPC .......... 257/76, 288, 347, 316, 308, 328, 365, 257/E21.214, E21.19, E21.4, E21.411, 257/E21.444, E21.345; 438/157, 149, 142, 438/268, 478
See application file for complete search history.

(56) References Cited

U.S. PATENT DOCUMENTS

2003/0006409 A1*  1/2003  Ohba .............................. 257/18
2005/0035391 A1*  2/2005  Lee et al. ...................... 257/308

(Continued)

FOREIGN PATENT DOCUMENTS

JP    2011243978 A  * 12/2011

OTHER PUBLICATIONS

English translation of JP 2011243978 A.*

*Primary Examiner* — Amar Movva
*Assistant Examiner* — Sheikh Maruf
(74) *Attorney, Agent, or Firm* — Ohlandt Greeley Ruggiero & Perle L.L.P.

(57) ABSTRACT

The present disclosure relates to nitride semiconductor and a fabricating method thereof, and a nitride semiconductor according to an exemplary embodiment of the present disclosure includes a nitride based first and second electrode placed with a distance on a substrate, a nitride based channel layer which connects the first and second electrode, an insulating layer which covers the channel layer, and a third electrode which is formed to cover the insulating layer on the insulating layer.

8 Claims, 7 Drawing Sheets

(56) References Cited

U.S. PATENT DOCUMENTS

| | | | |
|---|---|---|---|
| 2005/0051825 A1* | 3/2005 | Fujiwara et al. | 257/308 |
| 2005/0145932 A1* | 7/2005 | Park et al. | 257/328 |
| 2005/0153485 A1* | 7/2005 | Ahmed et al. | 438/142 |
| 2005/0263821 A1* | 12/2005 | Cho et al. | 257/347 |
| 2007/0126026 A1* | 6/2007 | Ueno et al. | 257/192 |
| 2008/0093626 A1* | 4/2008 | Kuraguchi | 257/190 |
| 2008/0157121 A1* | 7/2008 | Ohki | 257/194 |
| 2010/0019321 A1* | 1/2010 | Cho et al. | 257/365 |
| 2011/0291190 A1* | 12/2011 | Xiao et al. | 257/347 |
| 2012/0217542 A1* | 8/2012 | Morita | 257/140 |
| 2013/0069117 A1* | 3/2013 | Yoshioka et al. | 257/194 |
| 2013/0248931 A1* | 9/2013 | Saito et al. | 257/194 |
| 2013/0292699 A1* | 11/2013 | Ueno et al. | 257/76 |

* cited by examiner

NITRIDE SEMICONDUCTOR AND FABRICATING METHOD THEREOF

CROSS-REFERENCE TO RELATED APPLICATIONS

This application claims priority from Korean Patent Application No. Oct. 16, 2012, filed in the Korean Intellectual Property Office on No. 2012-0114873, the disclosure of which is incorporated herein by reference.

BACKGROUND OF THE INVENTION

1. Field of the Invention

Methods and apparatuses consistent with the exemplary embodiments relate to nitride semiconductor and a fabricating method thereof, and more particularly to GaN based compound semiconductor with a high concentration nano size fin shape without heterojunction, and a fabricating method thereof 2. Description of the Prior Art In general, silicon (Si) and gallium arsenic (GaAs) is widely used in semiconductor for application to low power and low frequencies. However, due to a narrow bandgap and breakdown voltage, the aforementioned semiconductor material could not be used in high power high frequency application devices to a desired extent. For example, Si has a bandgap of 1.12 eV and 1.42 eV at room temperature.

Accordingly, in application devices and elements of high power, high temperature and high frequency, much interest was drawn to broad bandgap semiconductor material such as silicon carbide and group III nitride. For example, α-SiC has a bandgap of 2.996 eV, and GaN of group III nitride has a bandgap of 3.36 eV at room temperature. As such, material for silicon carbide and group III nitride have electric field breakdown strengths and electron saturation velocity higher than GaAs and Si.

An element which draws particular interest as a high power, high temperature and high frequency is high electron mobility transistor (HEMT) well known as modulation doped field effect transistor; MODFET. Such an element is formed by heterojunction of two semiconductor material having bandgap energy with different 2-Dimensional Electron Gas (2DEG-2), wherein since any material with better bandgap has higher electron affinity, it provides advantages in various environments. 2DEG is an undoped accumulation layer of narrow bandgap material, and includes a very high sheet electron concentration of approximately 1012 to 1013 carrier/cm$^2$. In addition, electrons generated in doped broad bandgap semiconductor is transmitted to 2DEG, enabling high electron mobility by reduced ion impurity dispersion.

Meanwhile, a conventional HEMT element grows 2 layers such as AlGaN and GaN for example in order to perform heterojunction, wherein it is very difficult for AlGaN to grow.

In addition, in a case of using GaN as a power switch element, there needs to be a normally off characteristic, but due to heterojunction, it is always normally on, which is a problem.

SUMMARY OF THE INVENTION

An aspect of the exemplary embodiments relates to gallium nitride based compound semiconductor, with an object to provide gallium nitride semiconductor having high concentration nano size fin shape without heterojunction.

According to an exemplary embodiment of the present disclosure, nitride semiconductor may include a nitride based first electrode and second electrode placed with a distance on a substrate; a nitride based channel layer which connects the first electrode and second electrode; an insulating layer which covers the channel layer; and a third electrode which is formed to cover the insulating layer on the insulating layer.

Herein, the first electrode, second electrode and channel layer may be formed to be integrated with a same material.

The nitride semiconductor may further include a high resistance gallium nitride (GaN) layer formed on the substrate, and the first electrode, second electrode and channel layer may be formed with gallium nitride (GaN) doped with silicon.

A width (W) of formation of the channel layer in a direction vertical to a direction towards the first electrode and second electrode may be different to a width of the first electrode and second electrode.

In addition, a thickness and width of the first electrode, second electrode and channel layer formed on the substrate may be of nano size.

According to an exemplary embodiment of the present disclosure, a method of fabricating nitride semiconductor may include forming a nitride based first electrode and second electrode with a distance from each other on a substrate; forming a nitride based channel layer which connects the first electrode and second electrode; forming an insulating layer which covers the channel layer; and forming a third electrode which covers the insulating layer on the insulating layer.

Herein, the first electrode, second electrode and channel layer may be formed to be integrated with a same material.

The method of fabricating nitride semiconductor may further include forming a high resistance gallium nitride (GaN) layer on the substrate, and the first electrode, second electrode and channel layer may be formed with gallium nitride (GaN) doped with silicon.

A width (W) of formation of the channel layer in a direction vertical to a direction towards the first electrode and second electrode may be different to a width of the first electrode and second electrode.

A thickness and width of the first electrode, second electrode and channel layer formed on the substrate may be of nano size.

According to an exemplary embodiment of the present disclosure, a method of fabricating nitride semiconductor may include preparing a substrate; forming a first gallium nitride layer on the substrate; forming a second gallium nitride layer on the first gallium nitride layer; etching the second gallium nitride layer to form a channel layer which connects a first electrode and second electrode distanced from each other with the first and second electrode; forming an insulating layer on the channel layer; and forming a third electrode on the insulating layer.

The first gallium nitride (GaN) layer may be formed with a high resistance gallium nitride (GaN), and the second gallium nitride layer may be formed with gallium nitride (GaN) doped with silicon.

A thickness and width of the first electrode, second electrode and channel layer formed on the substrate may be of nano size.

According to an exemplary embodiment of the present disclosure, nitride semiconductor may include a nitride based first electrode and second electrode placed with a distance on a substrate having a penetrating hole; a nitride based channel layer which connects the first electrode and second electrode; an insulating layer which covers the channel layer; and a third electrode which is electrically connected to each other through the penetrating hole in both surfaces of the substrate, and is formed to cover the insulating layer.

Herein, the substrate may expose both ends of the third electrode through the penetrating hole, and the both ends of the third electrode may be electrically connected to each other.

In addition, the substrate may further expose the channel layer through the penetrating hole, and may further include an insulating layer which is formed on the exposed channel layer.

BRIEF DESCRIPTION OF THE DRAWINGS

The above and/or other aspects of the present disclosure will be more apparent by describing certain present disclosure with reference to the accompanying drawings, in which.

DETAILED DESCRIPTION

Certain exemplary embodiments are described in higher detail below with reference to the accompanying drawings.

Figure 1:
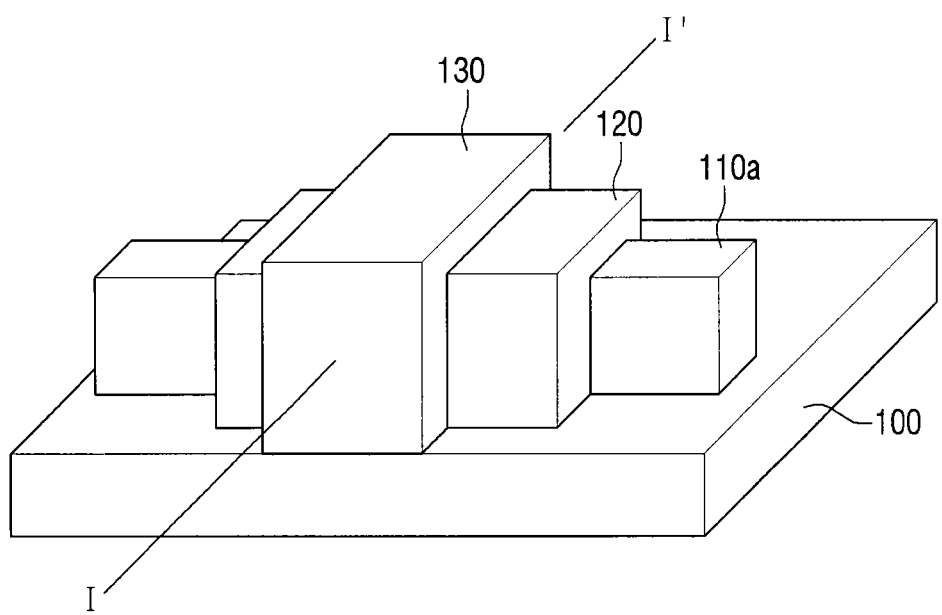
FIG. 1 is a view illustrating a structure of gallium nitride semiconductor according to an exemplary embodiment of the present disclosure.
Figure 2:
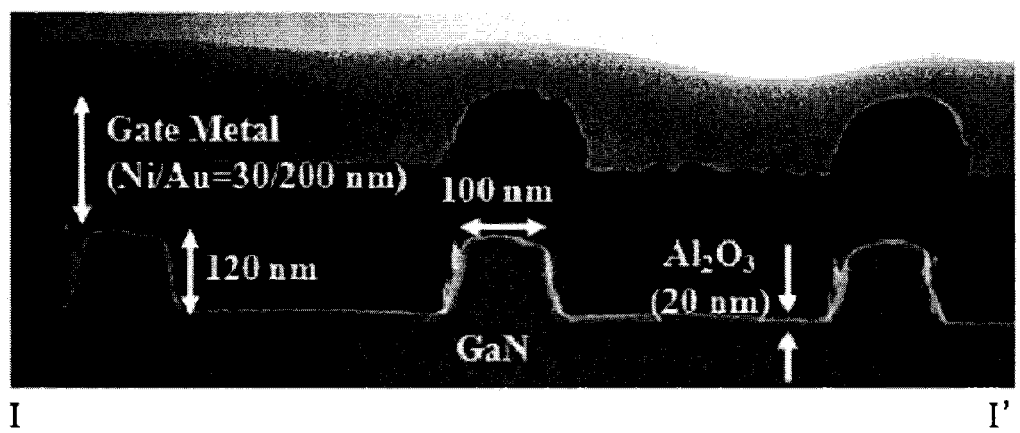
FIG. 2 is a cross-sectional view cut along a section of FIG. 1.

FIG. 1 is a view illustrating in detail a structure of nitride semiconductor according to an exemplary embodiment of the present disclosure, and FIG. 2 is a cross-sectional diagram cut along section (I-I') of FIG. 1.

As illustrated in FIGS. 1 and 2, nitride semiconductor according to an exemplary embodiment of the present disclosure includes a substrate 100, conductive layer 110a, insulating layer 120, and a part or all of a third electrode 130, and the conductive layer 110a may include a first electrode, second electrode and channel layer.

Herein, to include a part or all of a third electrode 130 means that some configurative elements have been omitted, or some of the configurative elements have been integrated into other configurative elements, just as in forming a conductive layer 110a where a first electrode, second electrode, and channel layer are integrated by one same material, and here, the explanation is based on a case where all configurative elements are included for convenience of explaining The substrate 100 is for example a sapphire substrate, and may further include a high resistance GaN layer. As such, a high resistance GaN layer may grow using a MOCVD(Metalorganic Chemical Vapor Deposition) equipment. Herein, MOCVD is a chemical depositing method of effusing raw gas above a high temperature substrate, and causing a breakup reaction to occur on its surface to form a thin film.

In addition, on the substrate 100, a first electrode(not illustrated) and second electrode(not illustrated) placed with a distance from each other, and a channel layer connecting the first electrode and second electrode. Herein, the first electrode, second electrode and channel layer are formed for instance, by GaN doped with silicon. In addition, the first electrode and second electrode refers to for instance, a source and drain electrode. According to an exemplary embodiment of the present disclosure, it is desirable that the first electrode, second electrode and channel layer are formed in nano size units. For example, after growing a silicon-doped GaN by approximately 120 nm thickness on the substrate, a fin shaped conductive layer 110a is formed by performing patterning of fin shapes of nano size in an E-beam lithography process, and etching the GaN layer. The patterning may be performed in other methods besides the E-beam lithography process in order to form nano size fins. Based on the above, it is desirable that the first electrode, second electrode and channel layer on the substrate 100 form a conductive layer 110a integrated with a same material.

Herein, the fin shaped GaN layer has a width (W) of 40~100 nm. Herein, the fin shape refers to having roughly a fin shape, that is a straight shape, but to be precise, in a case where a width of the channel layer is formed to be narrower than the width of the first electrode and second electrode placed with a distance from each other on the substrate 100, it may for a H or I shape. Herein, the width is defined as the width in the direction vertical to the direction towards the first electrode and second electrode. Such a width of the channel layer may be adjusted in various ways, and thus there will be no limitations to those shapes in the exemplary embodiment of the present disclosure.

The exemplary embodiment of the present disclosure has a characteristic where even when a gate voltage (Vg) is a (+) voltage according to the size of the fin width, current is turned off and is normally off. The reason is because the characteristic of normally off is that current does not flow even if Vg is 0V, and in the exemplary embodiment of the present invention, the fin width is small, and thus falls into a depleted state by the gate voltage, and so the current does not flow and only when a high gate voltage is applied, the current is accumulated and flows. On the other hand, when the fin width gets bigger, the normally off characteristic does not occur. Therefore, in the exemplary embodiment of the present disclosure, the fin width is very important.

On the channel layer of the conductive layer 110a, an insulating layer 120 is formed. Such an insulating layer 120 may be formed by depositing an Al2O3 insulator (or insulating film) of for instance 20 nm on the substrate 100, and then by removing the insulator corresponding to the first and second electrode areas for connection with the outside. The insulating layer 120 formed as such may be called as a gate insulating film or oxide layer etc. since it is insulated with the third electrode 130 that is the gate electrode using the oxide. Herein, oxide is another insulator material such as SiO2, Si3N4, HfO2 besides Al2O3, but oxide may be another insulator material of its combination, and although a thickness of 20 nm is adequate, according to circumstances, other thicknesses are also possible in order to have other characteristics such as obtaining a high threshold voltage.

In addition, a third electrode 130 is formed on the insulating layer 120. Such a third electrode 130 is for example a gate electrode, which forms an FET element together with a source and drain electrode.

The exemplary embodiment of the present disclosure has channel and gate electrode of nano size which cover (or surround, enclose, wreathe) three surfaces, more particularly the surfaces besides the side in contact with the substrate 100, and thus has very small leakage current, high current characteristics, and high breakdown voltage. The reason is because when gate voltage is open, 3 surfaces of the nano channel is covered by the gate electrode, and thus creates a full depletion. Accordingly, there is almost no leakage current, but high breakdown voltage. On the other hand, when the gate voltage is turned on, since 3 surfaces of the nano channel is covered by the gate electrode, the current is accumulated, and thus more current flows than when the gate electrode is formed on only one side, and further, since the GaN layer is doped in n-type and high concentration, series resistance of the element is reduced, thereby enabling more current to flow. Accordingly, current characteristics change depending on how much the doped concentration is. In addition, the doped concentration may differ according to the thickness and width of the nano channel.

In short, the exemplary embodiment of the present disclosure creates a GaN layer doped in high concentration of $5\times1018$ cm$^3$, forms a channel of nano size, and has the gate electrode to cover 3 surfaces of the channel. When we embody this into an element and make an electrical measurement, the results will show very small leakage current (Ioff=10-13A), high current characteristics (Id,max=670 mA/mm), and high breakdown voltage (BV=280 V). in addition, depending on the fin size, current is turned off even when Vg is (+) voltage, showing normally off characteristics. Accordingly, the element can be usefully used as a high performance and high power element.

FIGS. 3 to 6 are views illustrating a method of fabricating nitride semiconductor according to an exemplary embodiment of the present disclosure.

Figure 3:
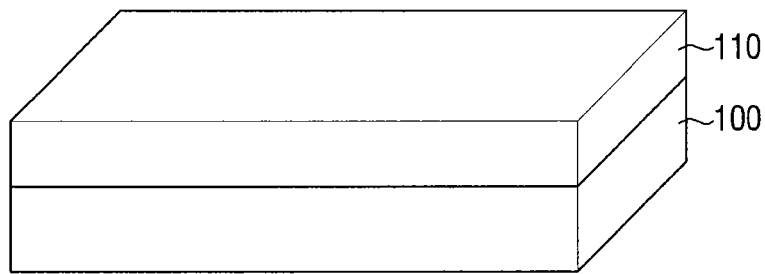
FIG. 3 to FIG. 6 are views illustrating a method of fabricating nitride semiconductor according to an exemplary embodiment of the present disclosure.
Figure 4:
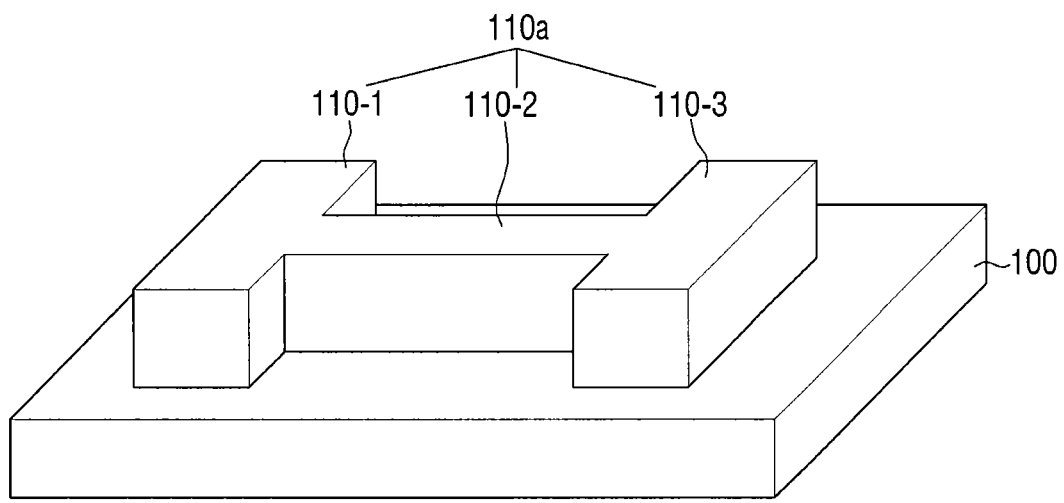
Figure 5:
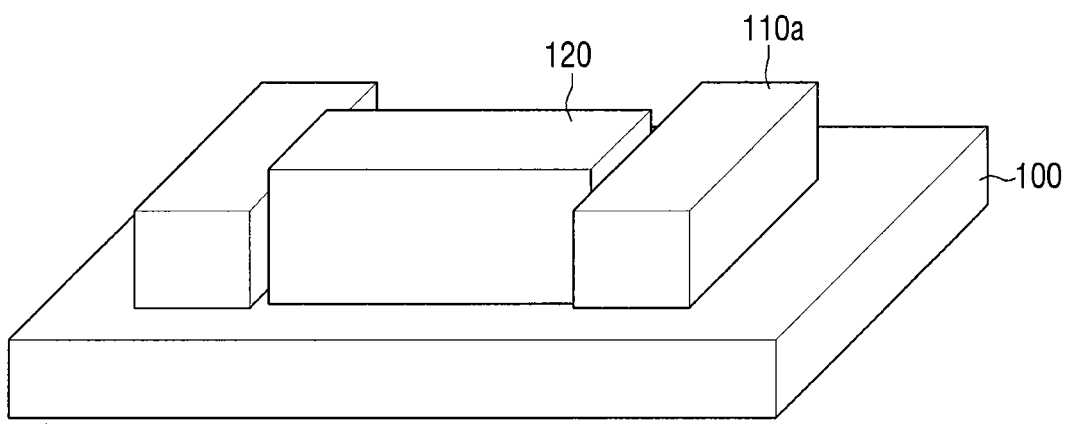
Figure 6:
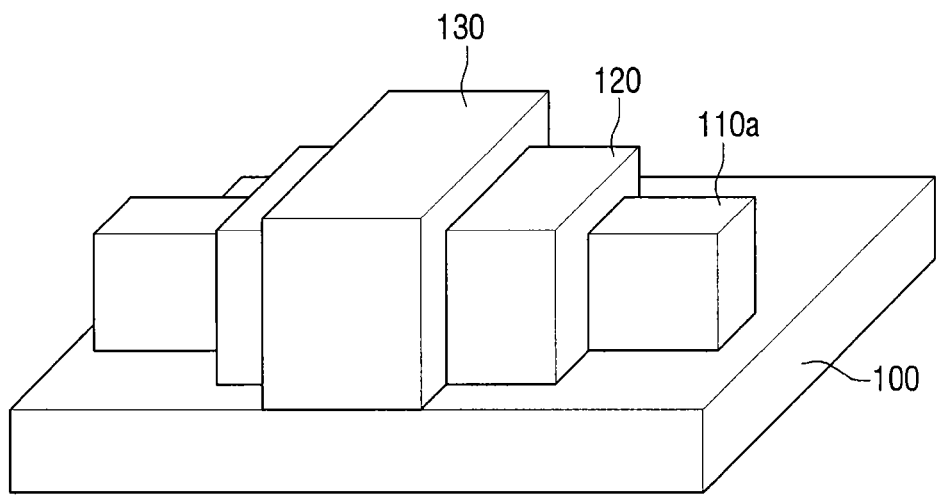

As illustrated in FIG. 3, in order to make a nitride semiconductor element, first of all, a substrate 100 is prepared, and a GaN layer 100 doped with silicon is grown on the substrate 100. Herein, the thickness of growth may be 120 nm, and the doped concentration may be approximately 1018 cm−3. Furthermore, on the substrate 100, a high resistance GaN layer may be further grown before forming a GaN layer 100 doped with silicon.

Next, after a patterning of the nano channel with the first and second electrodes (110_1, 110_3) connected thereto through an E-beam lithography process, etching is performed in a RIE (Reactive Ion Etching) equipment. Herein, the E-beam lithography process means selectively radiating on for instance a wafer surface, which doesn't need a mask unlike light radiation printing. Through this process, a fin shaped conductive layer 110a is formed as in FIG. 4. Herein, the conductive layer 110a includes a first electrode 110_1, channel layer 110_2, and second electrode 110_3. Herein, it is desirable that the width of the channel layer 110_2, that is the width of the nano channel is formed in a range of 40~100 nm. Meanwhile, in order to alleviate plasma damage after etching, the GaN surface may be softened by dipping it in a TMAH solution.

Next, after depositing for example Al2O3 insulating body of 20 nm as an insulating film on the substrate 100, the insulator is removed from the area of the first electrode 110_1 and second electrode 110_3 of the source and drain area for connection with outside. Through this, an insulating layer 120 is formed on the channel layer 110_2 as in FIG. 5.

By this method, the insulating layer 120 turns to have a shape of covering 3 surfaces of the channel layer 110_2. Of course, it is expressed that the insulating layer 120 covers 3 surfaces since it is exemplified in FIGS. 4 and 5 that the channel layer 110_2 has a square shape, but since the channel layer 110_2 may be formed in a circular or triangular shape instead of a square shape, there is no particular limitation to the shape of the channel layer 110_2 in the exemplary embodiment of the present disclosure.

In addition, in the area surrounding the first electrode 110_1, second electrode 110_3, metals such as Ti, Al, Ni and Au etc. may be further deposited to form a high resistance GaN layer and ohmic.

Next, on the insulating layer 120, a third electrode 130, for example, a gate electrode is formed. In other words, in order to form a gate electrode, Ni and Au etc. are deposited, patterned, to complete a final element having a gate, source and drain electrode. Herein, it is illustrated that the length of the gate electrode is 1 μm, but the length may be longer or shorter.

Meanwhile, so far the explanation was made on a conductive layer 110a where the first electrode 110_1, channel layer 110_2, and second electrode 110_3 are integrated in same material, with reference to FIGS. 3 to 6, but it is also possible to form the first electrode 110_1 and second electrode 110_3 on the substrate 110 with the same material and to be distanced from each other, and then form a channel layer 110_2 made in a different material, and thus there is no particular limitation thereto as to whether the channel layer is integrated into a same material or not.

Figure 7:
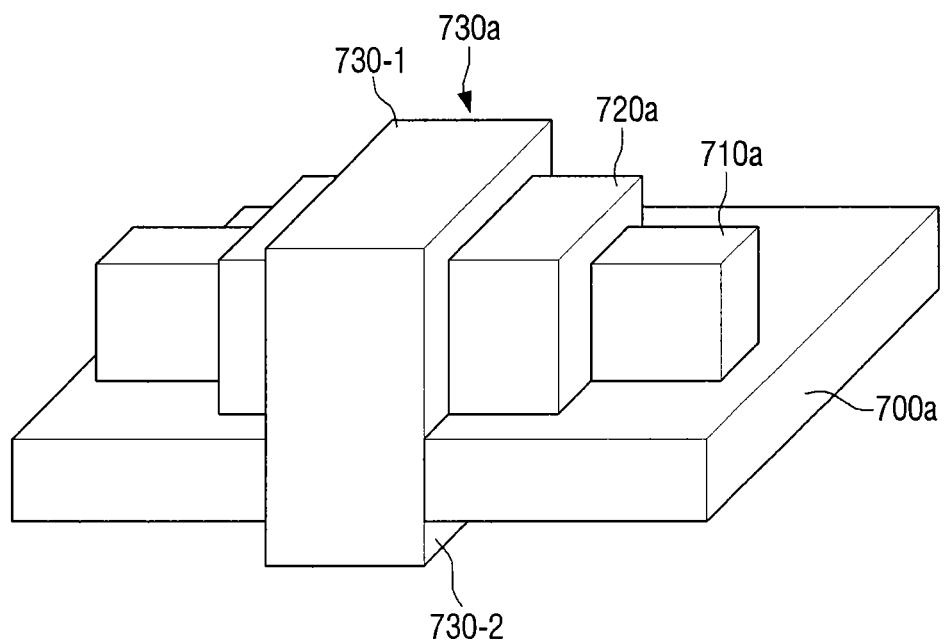
FIG. 7 is a view illustrating a structure of nitride semiconductor according to another exemplary embodiment of the present disclosure.

FIG. 7 is a view illustrating a structure of nitride semiconductor according to another exemplary embodiment of the present disclosure.

As illustrated in FIG. 7, a nitride semiconductor element according another exemplary embodiment of the present disclosure includes a substrate 700a, conductive layer 710a, insulating layer 720a, and a portion or all of a third electrode 730a, and the conductive layer 710a may include a first electrode, second electrode, and channel layer.

In comparison with the nitride semiconductor element of FIG. 1, the nitride semiconductor element of FIG. 7 further includes a rear surface of the substrate 700a, more particularly a third electrode 730_2 on its lower end portion, and thus the third electrode 730a has a structure of covering the four surfaces of the channel layer.

To this end, the substrate 700a may desirably expose a portion of the channel layer and both ends of the third electrode 730a together, or may expose only the both ends of the third electrode 730a. In other words, in a case of exposing the portion of the channel layer and the both ends of the third electrode 730a together, the nitride semiconductor element of FIG. 7 may additionally form an additional insulating layer formed on the channel layer, and then form the third electrode 730a. In a case of exposing only the both ends of the third electrode 730a, it will be possible to use the substrate 700a as an insulating layer, but form a third electrode 730_2 on the lower side to be electrically connected to the third electrode 730_1 on the upper side.

Regarding other substrate 700a, conductive layer 710a, insulating layer 720a, and third electrode 730a besides the above, there is little difference with the substrate 100, conductive layer 110a, insulating layer 720 and third electrode 130 of FIG. 1, and thus further explanation is omitted.

As a result of the above, the nitride semiconductor element forms a structure where the third electrode 730a as a gate electrode covers the 4 surfaces around the channel layer, thereby resulting in a higher current and lower leakage current characteristic when it is turned off.

So far the structure where the third electrode 730a covers the four surfaces of the channel layer was briefly explained based on two cases through another exemplary embodiment of the present disclosure, but changes could be made as well. Therefore, in the exemplary embodiment of the present disclosure, there is no particularly limitation to the above structure.

Meanwhile explanation on a method of fabricating nitride semiconductor element according to another exemplary embodiment will be omitted since it would be same as that made with reference to FIGS. 3 to 7.

However, to briefly explain again, nitride semiconductor element is formed through the process of FIGS. 3 to 6, and the substrate of a predetermined area is removed. Next, the channel layer and third electrode 730a may be formed additionally through the photolithography process. In a case of forming only the third electrode 730*a*, the third electrode 730*a* may be formed in the photolithography process.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. Nitride semiconductor comprising:
   a high resistance nitride layer on a substrate;
   a nitride based first electrode and second electrode placed with a distance from each other on the high resistance nitride layer;
   a nitride based channel layer which connects the first electrode and second electrode;
   an insulating layer which surrounds a surface of the channel layer; and
   a third electrode which is formed to surround a surface of the insulating layer on the insulating layer.

2. The nitride semiconductor according to claim 1, wherein the first electrode, second electrode and channel layer are formed to be integrated with a same material.

3. The nitride semiconductor according to claim 2, wherein the high resistance nitride layer is a high resistance gallium nitride (GaN) layer, wherein the first electrode, second electrode and channel layer are formed with gallium nitride (GaN) doped with silicon.

4. The nitride semiconductor according to claim 1, wherein a width (W) of formation of the channel layer in a direction vertical to a direction towards the first electrode and second electrode is different from as a width of the first electrode and second electrode.

5. The nitride semiconductor according to claim 1, a thickness and width of the first electrode, second electrode and channel layer formed on the substrate are of nano size.

6. Nitride semiconductor comprising:
   a nitride based first electrode and second electrode placed with a distance from each other on a substrate having a penetrating hole;
   a nitride based channel layer which connects the first electrode and second electrode;
   an insulating layer which surrounds a surface of the channel layer; and
   a third electrode which is electrically connected through the penetrating hole in both surfaces of the substrate, and is formed to surround the insulating layer;
   wherein the nitride semiconductor is Gate-All-Around (GAA) structure where the third electrode, or gate electrode, surrounds the channel layer on all sides.

7. The nitride semiconductor according to claim 6, wherein the substrate exposes both ends of the third electrode through the penetrating hole, and the both ends of the third electrode are electrically connected to each other.

8. The nitride semiconductor according to claim 7, wherein the substrate further exposes the channel layer through the penetrating hole, and further comprises an insulating layer which is formed on the exposed channel layer.

* * * * *